United States Patent
Warnock et al.

(10) Patent No.: US 6,822,500 B1
(45) Date of Patent: Nov. 23, 2004

(54) METHODS AND APPARATUS FOR OPERATING MASTER-SLAVE LATCHES

(75) Inventors: James D. Warnock, Somers, NY (US); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/651,176

(22) Filed: Aug. 28, 2003

(51) Int. Cl.[7] .............................................. G06F 1/04
(52) U.S. Cl. ........................ 327/295; 327/202; 326/93
(58) Field of Search ................................ 327/199–203, 327/291, 295, 225, 292; 326/46, 93–97

(56) References Cited

U.S. PATENT DOCUMENTS

| | | | | |
|---|---|---|---|---|
| 5,130,568 A | * | 7/1992 | Miller et al. ................. | 327/202 |
| 5,426,380 A | * | 6/1995 | Rogers ......................... | 326/46 |
| 5,471,152 A | * | 11/1995 | Gheewala et al. ........... | 324/758 |
| 5,742,190 A | * | 4/1998 | Banik et al. ................. | 327/152 |
| 5,999,030 A | * | 12/1999 | Inoue .......................... | 327/202 |
| 6,560,737 B1 | * | 5/2003 | Colon-Bonet et al. ....... | 714/726 |

* cited by examiner

*Primary Examiner*—Minh Nguyen
(74) *Attorney, Agent, or Firm*—Dugan & Dugan

(57) ABSTRACT

A method for operating a master latch and a slave latch coupled to the master latch includes the steps of attempting to operate the master latch and the slave latch in a first mode in which (1) the master latch is held in an open condition; and (2) the slave latch is pulsed so as to latch data passed through the open master latch. If the master latch and the slave latch do not operate in the first mode, the master latch and the slave latch are operated in a second mode in which (1) a first clock signal is employed to latch data with the master latch; and (2) a second clock signal is employed to latch data latched by the master latch with the slave latch.

19 Claims, 3 Drawing Sheets

METHODS AND APPARATUS FOR OPERATING MASTER-SLAVE LATCHES

FIELD OF THE INVENTION

The present invention relates generally to integrated circuit design, and more particularly to methods and apparatus for operating master-slave latches.

BACKGROUND OF THE INVENTION

Master-slave latches are employed commonly in integrated circuit design. In a master-slave latch, a master latch latches data in response to a first clock signal, and a slave latch coupled to the master latch latches data (latched by the master latch) in response to a second clock signal. Typically the first and second clock signals are approximately complimentary (e.g., 180 degrees out of phase).

To save power, it is known to operate a master-slave latch in a pulsed mode in which the master latch is held open and the slave latch is pulsed to latch data that passes through the master latch while the master latch is held open. Because the master latch never switches, a pulsed mode of operation significantly reduces power consumption.

While a pulsed mode of operation reduces power consumption, such a mode of operation is susceptible to a number of problems. If the pulse employed to latch data into the slave latch is too wide, the master-slave latch may be susceptible to early mode problems such as race through (e.g., as both master and slave latches are active simultaneously for the duration of the slave latching pulse). Likewise, if the pulse employed to latch data into the slave latch is too narrow, data may not be reliably latched by the slave latch. Accordingly, designing and implementing a pulsed mode of operation for a master-slave latch is difficult, and often requires multiple design and test iterations. Therefore, improved methods and apparatus for operating master-slave latches would be desirable.

SUMMARY OF THE INVENTION

In a first aspect of the invention, a method is provided for operating a master latch and a slave latch coupled to the master latch. The method includes the step of attempting to operate the master latch and the slave latch in a first mode in which (1) the master latch is held in an open condition; and (2) the slave latch is pulsed so as to latch data passed through the open master latch. If the master latch and the slave latch do not operate in the first mode, the master latch and the slave latch are operated in a second mode in which (1) a first clock signal is employed to latch data with the master latch; and (2) a second clock signal is employed to latch data latched by the master latch with the slave latch.

In a second aspect of the invention, an apparatus is provided that includes a clock generation circuit adapted to couple to (e.g., drive) a master latch and a slave latch. The clock generation circuit is adapted to operate in a first state in which the clock generation circuit generates (1) a first clock signal for latching data with the master latch; and (2) a second clock signal for latching data latched by the master latch with the slave latch. The clock generation circuit is also adapted to operate in a second state in which the clock generation circuit generates (1) a hold signal for holding the master latch in an open condition; and (2) a pulse signal for directing the slave latch to latch data passed through the master latch while the master latch is held in the open condition by the hold signal. The apparatus further includes a switching circuit coupled to the clock generation circuit and adapted to switch the clock generation circuit between the first state and the second state. Numerous other aspects are provided.

Other features and aspects of the present invention will become more fully apparent from the following detailed description, the appended claims and the accompanying drawings.

DETAILED DESCRIPTION

Figure 1:
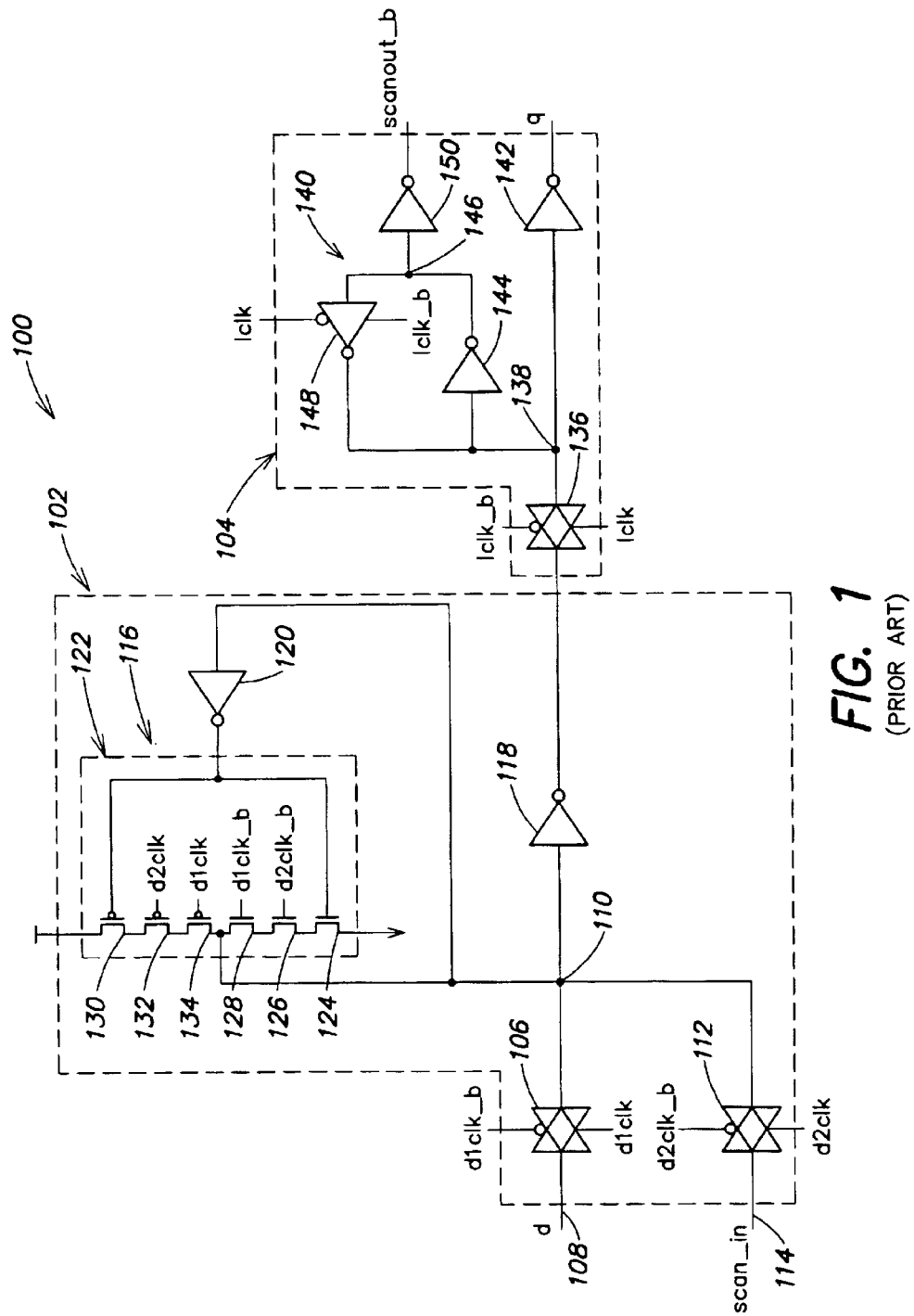
FIG. 1 is an exemplary embodiment of a conventional master-slave latch for which the present invention may be employed.

FIG. 1 is an exemplary embodiment of a conventional master-slave latch 100 for which the present invention may be employed. With reference to FIG. 1, the master-slave latch 100 includes a master latch portion 102 coupled to a slave latch portion 104.

The master latch portion 102 includes a first transmission gate 106 coupled between a data (d) input 108 and a first node 110, and a second transmission gate 112 coupled between a scan-in input 114 and the first node 110. The master latch portion 102 also includes a first latching circuit 116 coupled to the first node 110. A first output inverter 118, which may or may not be part of the master latch portion 102, has an input coupled to the first node 110 and an output coupled to the slave latch portion 104.

The first latching circuit 116 includes a first inverter 120 having an input coupled to the first node 110 and an output coupled to an input of a first gated inverter 122. An output of the first gated inverter 122 is coupled to the first node 110. As shown in FIG. 1, the first gated inverter 122 includes a first n-channel metal-oxide-semiconductor field-effect transistor (NFET) 124, a second NFET 126 and a third NFET 128 coupled between ground and the output of the first gated inverter 122, and a first p-channel metal-oxide-semiconductor field-effect transistor (PFET) 130, a second PFET 132 and a third PFET 134 coupled between a supply voltage and the output of the first gated inverter 122. A gate of the first NFET 124 and a gate of the first PFET 130 are coupled to the output of the first inverter 120.

The slave latch portion 104 includes a third transmission gate 136 coupled between the output of the first output inverter 118 and a second node 138. The slave latch portion 104 also includes a second latching circuit 140 coupled to the second node 138. A second output inverter 142 has an input coupled the second node 138 and an output that serves as a data output (q) for the slave latch portion 104.

The second latching circuit 140 includes a second inverter 144 having an input coupled to the second node 138 and an output coupled to a third node 146, and a second gated inverter 148 having an input coupled to the third node 146. An output of the second gated inverter 148 is coupled to the second node 138. A third output inverter 150 has an input coupled to the third node 146 and an output that serves as an inverted data output (scanout_b) for the slave latch portion 104.

In operation, a first clock signal is employed to latch data into the master latch portion 102, and a second clock signal is employed to latch data (which has been latched by the master latch portion 102) into the slave latch portion 104. In the embodiment shown, the first clock signal for latching data into the master latch portion 102 may be either a first data clock signal (d1clk or its inverse d1clk_b) or a second data clock signal (d2clk or its inverse d2clk_b). That is, only one or the other of d1clk or d2clk is employed.

If d1clk is employed, a high logic state on d1clk (or a low logic state on d1clk_b) causes the first transmission gate 106 to allow data present on data d input 108 to pass through the first transmission gate 106 to the first node 110. A low logic state on d1clk prevents such data transmission. Alternatively, if d2clk is employed, a high logic state on d2clk (or a low logic state on d2clk_b) causes the second transmission gate 112 to allow data present on scan-in input 114 to pass through the second transmission gate 112 to the first node 110. A low logic state on d2clk prevents such data transmission.

The first latching circuit 116 maintains the logic state provided to the first node 110 by the first or second transmission gate 106, 112 when the respective transmission gate 106, 112 is closed so that the slave latch portion 104 may latch such data. For example, with both d1clk and d2clk at a low logic state (and d1clk_b and d2clk_b at a high logic state) and the first and second transmission gates 106, 112 closed, the second and third NFETs 126, 128 and the second and the third PFETs 132, 134 are all ON. If a low voltage was provided to the first node 110 by the first or second transmission gate 106, 112, the first NFET 126 is ON and the first PFET 130 is OFF. With the first, second and third NFETs 124–128 ON, the first node 110 is coupled to ground by the NFETs 124–128. The low voltage of the first node 110 thereby is maintained. In the alternative, if a high voltage was provided to the first node 110 by the first or second transmission gate 106, 112, the first NFET 124 is OFF and the first PFET 130 is ON. With the first, second and third PFETs 130–134 ON, the first node 110 is coupled to the supply voltage by the PFETs 130–134. The high voltage of the first node 110 thereby is maintained.

The voltage provided to the first node 110 by the first or second transmission gate 106, 112 is inverted and provided to the slave latch portion 104 via the first output inverter 118. As stated above, a second clock signal (1clk or its inverse 1clk_b) is employed to latch data (which has been latched by the master latch portion 102) into the slave latch portion 104. Specifically, a high logic state on 1clk (or a low logic state on 1clk_b) causes the third transmission gate 136 to allow data output by the first output inverter 118 to pass through the third transmission gate 136 to the second node 138. A low logic state on 1clk prevents such data transmission.

The second latching circuit 140 operates similarly to the first latching circuit 116 to maintain the logic state provided to the second node 138 by the third transmission gate 136 when the transmission gate 136 is closed so that the slave latch portion 104 may output such data (e.g., to subsequent circuitry such as other latches, logic or the like). For example, with 1clk at a low logic state (and 1clk_b at a high logic state), the second gated inverter 148 is adapted to maintain either a low or high voltage level at the second node 138 in a manner similar to that employed by the first gated inverter 122 with regard to the first node 110. That is, if a low voltage was provided to the second node 138 by the third transmission gate 136, the second node 138 is coupled to ground to maintain the low voltage. Alternatively, if a high voltage was provided to the second node 138 by the third transmission gate 136, the second node 138 is coupled to a supply voltage to maintain the high voltage.

The voltage at the second node 138 is inverted by the second output inverter 142 and output (as data q). Additionally, the voltage at the second node 138 is twice inverted via the inverters 144, 150 and output (as data scanout_b).

Figure 2:
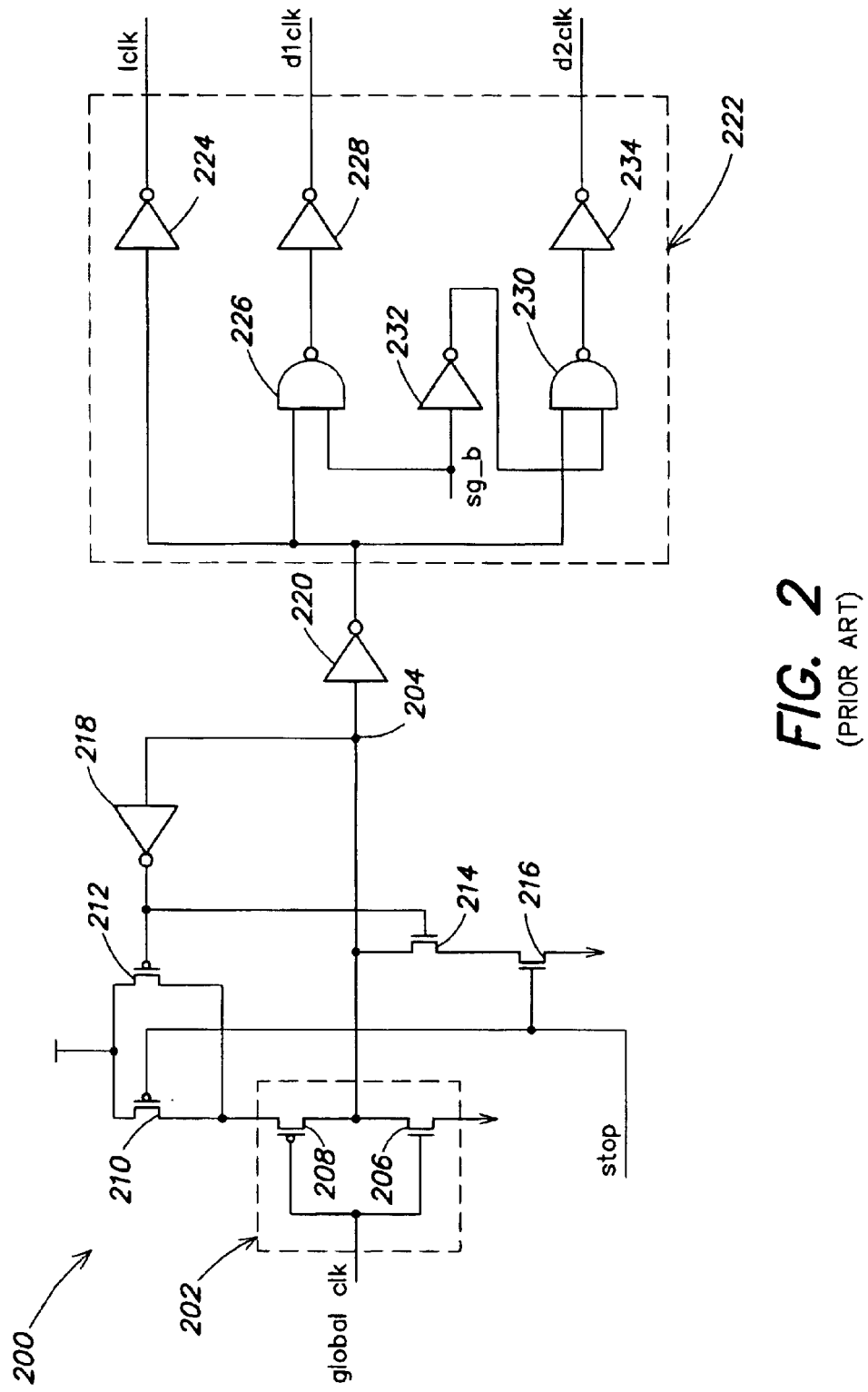
FIG. 2 is a schematic diagram of a conventional clock generation circuit for generating clock signals used to latch data into the master and slave latch portions of the master-slave latch of FIG. 1.

FIG. 2 is a schematic diagram of a conventional clock generation circuit 200 for generating the clock signals d1clk, d2clk and 1clk used to latch data into the master and slave latch portions 102, 104 of the master-slave latch 100 of FIG. 1. With reference to FIG. 2, the clock generation circuit 200 includes a first complementary metal-oxide-semiconductor (CMOS) inverter 202 having an input adapted to receive a global clock signal and an output coupled to a first node 204. The CMOS inverter 202 includes a first NFET 206 and a first PFET 208 coupled between ground and a supply voltage via parallel coupled PFETs (e.g., a second PFET 210 and a third PFET 212) as shown.

The clock generation circuit 200 also includes a second NFET 214 coupled between the first node 204 and ground via a third NFET 216. A gate of the second PFET 210 and a gate of the third NFET 216 serve as a STOP input to the clock generation circuit 200 as described further below.

A first feedback inverter 218 has an input coupled to the first node 204 and an output coupled to both a gate of the third PFET 212 and a gate of the second NFET 214. A second inverter 220 has an input coupled to the first node 204 and an output coupled to a clock output circuit 222.

The clock output circuit 222 includes a first output inverter 224 having an input coupled to the output of the second inverter 220 and an output that serves as the 1clk output of the clock generation circuit 200. The clock output circuit 222 also includes a first NAND gate 226 having a first input coupled to the output of the second inverter 220, a second input adapted to receive a d1clk/d2clk selection signal (sg_b) described below and an output coupled to an input of a second output inverter 228. An output of the second output inverter 228 serves as the d1clk output of the clock generation circuit 200. Finally, the clock output circuit 222 includes a second NAND gate 230 having a first input coupled to the output of the second inverter 220, a second input coupled to an output of a third inverter 232 and an output coupled to an input of a third output inverter 234. An output of the third output inverter 234 serves as the d2clk output of the clock generation circuit 200. An input of the third inverter 232 also is adapted to receive the d1clk/d2clk selection signal (sg_b).

In operation, a high logic state global clock signal turns the first NFET 206 ON and pulls the first node 204 low. With the first node 204 low, the 1clk output also is low. If sg_b is high, then the d1clk output of the clock generation circuit 200 is active (e.g., the first NAND gate 226 behaves as an inverter with regard to the output of the second inverter 220) and the d2clk output of the clock generation circuit 200 is inactive (e.g., the second NAND gate 230 outputs a high logic state and the d2clk signal is low regardless of the output of the second inverter 220). Likewise, if sg_b is low, then the d2clk output of the clock generation circuit 200 is active (e.g., the second NAND gate 230 behaves as an inverter with regard to the output of the second inverter 220) and the d1clk output of the clock generation circuit 200 is inactive (e.g., the first NAND gate 226 outputs a high logic state and the d1clk signal is low regardless of the output of the second inverter 220). Accordingly, only one of the d1clk and d2clk outputs is active at a time. Additionally, because of the presence of the first and second NAND gates 226, 230, the d1clk and d2clk outputs are approximately complimentary (e.g., approximately 180 degrees out of phase) with the 1clk output of the clock generation circuit 200. That is, the active one of the d1clk output or d2clk output is high while the 1clk output is low.

When the global clock signal switches low, the first NFET 206 turns OFF and the first PFET 208 turns ON. If the STOP input is low (e.g., the active state for the clock generation circuit 200), the second PFET 210 is ON and the first node 204 is pulled high (via the first and second PFETs 208, 210). A low STOP input also turns the third NFET 216 OFF. Note that a high STOP input turns the third PFET 210 OFF and the third NFET 216 ON and disables the clock generation circuit 200 from pulling the first node 204 high. Assuming the STOP input is low and the first node 204 has been pulled high via the first and second PFETs 208, 210, the output of the first inverter 218 is low and the third PFET 212 is ON (providing further drive current for holding the first node 204 high) and the second NFET 214 is OFF. Generally the STOP input is reset to a high logic state automatically (via circuitry not shown) after the global clock signal falls (e.g., once the third PFET 212 has turned ON). The STOP input typically goes low after the global clock signal rises (e.g., at about mid-cycle).

With the first node 204 high, the 1clk output of the clock generation circuit 200 also is high, and the active d1clk or d2clk (e.g., depending on the state of the sg_b input) is low. Accordingly, as the global clock signal switches between a high and low logic state, the 1clk output of the clock generation circuit 200 changes between a low and high logic state. Only one of the d1clk or d2clk outputs is active at a time, and the active d1clk or d2clk output switches approximately 180 degrees out of phase to the 1clk output and approximately in phase with the global clock signal. The d1clk or d2clk output and the 1clk output then may be employed to latch data via the master latch portion 102 and slave latch portion 104, respectively, of the master-slave latch 100 as described previously.

As stated previously, to save power, it is known to operate a master-slave latch such as the master-slave latch 100 of FIG. 1 in a pulsed mode in which the master latch is held open and the slave latch is pulsed to latch data that passes through the master latch while the master latch is held open. Because the master latch clock never switches, a pulsed mode of operation significantly reduces power consumption. However, selection of a proper pulse width is difficult (e.g., if the pulse employed to latch data into the slave latch is too wide, the master-slave latch may be susceptible to early mode problems such as race through and if the pulse employed to latch data into the slave latch is too narrow, data may not be reliably latched by the slave latch). As a result, designing and implementing a pulsed mode of operation for a master-slave latch is difficult, and often requires multiple design and test iterations.

To address the above difficulties, a novel clock generation circuit is provided that can generate the signals necessary to operate a master-slave latch in either a pulsed mode of operation or in a more typical, dual clock mode of operation in which both the master latch and the slave latch are clocked. Such a dual mode of operation is particularly advantageous during circuit design. For example, it may take months to obtain a hardware version of a circuit design. In a conventional pulsed mode master-slave latch design, if the pulsed mode operation of the master-slave latch fails during testing, the remainder of the circuit design may be impossible to test. However, through use of the present invention, master-slave latches may be switched from a failing, pulsed mode of operation to a fully functional, dual clock mode of operation. In this manner, a circuit design may be tested/operated even if master-slave latches employed by the circuit design fail to operate in a pulsed mode.

Figure 3:
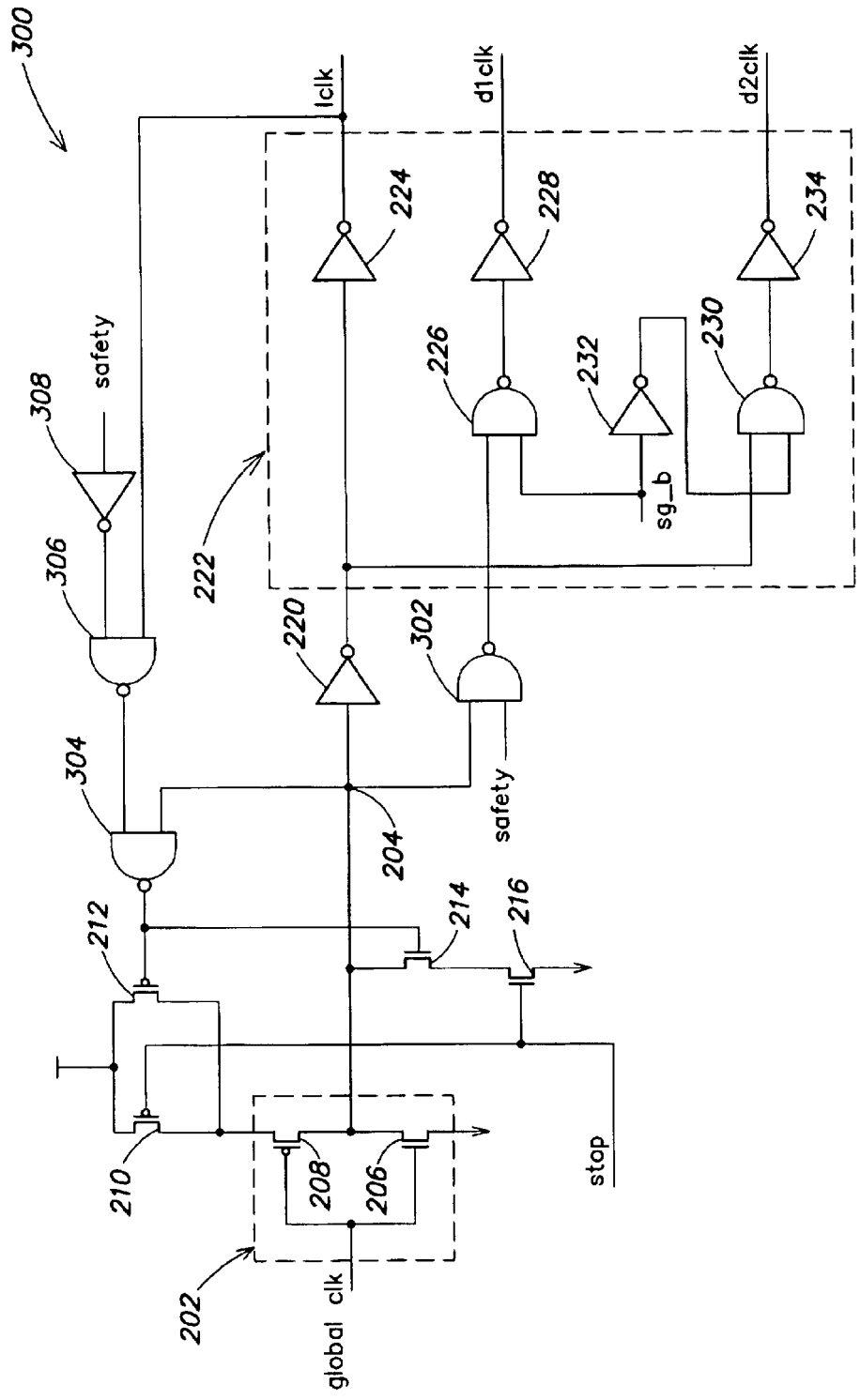
FIG. 3 is a schematic diagram of an inventive clock generation circuit that allows a master-slave latch to operate in either a pulsed mode or dual clock mode of operation.

FIG. 3 is a schematic diagram of an inventive clock generation circuit 300 that allows a master-slave latch to operate in either a pulsed mode or dual clock mode of operation. As shown in FIG. 3, the inventive clock generation circuit 300 is similar to the clock generation circuit 200 of FIG. 2 and includes a number of similar components. For convenience, functionally similar components are referred to by the same reference numerals in FIGS. 2 and 3.

With reference to FIGS. 2 and 3, the main differences between the conventional clock generation circuit 200 and the inventive clock generation circuit 300 are that in the inventive clock generation circuit 300:

(1) the first input of the first NAND gate 226 is not coupled to the output of the second inverter 220, but rather to an output of a feedforward NAND gate 302 (having a first input coupled to the first node 204 and a second input that serves as a SAFETY input as described further below);

(2) the first inverter 218 is replaced by a first feedback NAND gate 304 having an output coupled to the gates of the third PFET 212 and the second NFET 214 and a first input coupled to the first node 204; and (3) a second feedback NAND gate 306 is provided that has an output coupled to a second input of the first feedback NAND gate 304, a first input coupled to the output of the first output inverter 224 (the 1clk output) and a second input coupled to the SAFETY input via an inverter 308.

As stated the inventive clock generation circuit 300 may generate the signals required to operate a master-slave latch in either a dual clock mode (wherein both master latch and slave latch are clocked) or a pulsed mode (wherein the master latch is held open while the slave latched is pulsed). A switching circuit (e.g., one or more of the feedforward NAND gate 302, the first and second feedback NAND gates 304, 306 and/or the inverter 308) may be employed to switch between the two modes of operation.

To generate the signals for a dual clock mode of operation (e.g., requiring a first clock for clocking a master latch and a second clock for clocking a slave latch), the SAFETY input is held at a high logic state. With the SAFETY input high, the feedforward NAND gate 302 effectively operates as an inverter between the first node 204 and the first input of the first NAND gate 226. Likewise, with the SAFETY input high, the output of the inverter 308 is low, the output of the second feedback NAND gate 306 is high and the first feedback NAND gate 304 effectively operates as an inverter between the first node 204 and the gates of the third PFET 212 and the second NFET 214. Accordingly, because the feedforward NAND gate 302 and the first feedback NAND gate 304 effectively operate as inverters, the inventive clock generation circuit 300 operates similarly to the conventional clock generation circuit 200 of FIG. 2. That is, the clock generation circuit 300 generates an 1clk signal and either a d1clk or d2clk signal (depending on the logic state of the sg_b input). The 1clk signal and d1clk or d2clk signal are approximately complimentary. In such a dual clock mode of operation, the feedback logic (e.g., the second feedback NAND gate 306 and/or the first feedback NAND gate 304)

and the feedforward logic (e.g., the feedforward NAND gate 302) are disabled from providing the feedback and feed forward signals required for pulsed mode operation (described below).

To generate the signals for pulsed mode operation of a master-slave latch such as the master-slave latch 100 of FIG. 1 (e.g., a logic state/signal that holds a master latch open and a pulse signal that latches data passed through the master latch into the slave latch), the SAFETY input is held low (e.g., at 0 volts). With the SAFETY input low, the output of the feedforward NAND gate 302 is forced high. Accordingly, if the sg_b input to the first NAND gate 226 is high, the output of the first NAND gate 226 is driven low and the output of the second output inverter 228 (e.g., d1clk) is forced high. The high d1clk signal thereafter may be employed to maintain a master latch in an open condition. For example, the high d1clk signal may be employed to maintain the first transmission gate 106 of the master latch portion 102 of FIG. 1 in an open condition. In such a condition, data d input to the master latch portion 102 will pass through the first transmission gate 106 to the slave portion 104.

Alternatively, if the sg_b input to the first NAND gate 226 is low, the output of the first NAND gate 226 is driven high and the output of the second output inverter 228 is held low (e.g., d1clk is disabled). Further, with the sg_b input low, the d2clk output of the inventive clock generation circuit 300 is enabled and may be employed to latch data into a master latch (e.g., such as via the scan-in input of the second transmission gate 112 of FIG. 1) as described previously with reference to FIG. 2.

Referring to the feedback logic of the inventive clock generation circuit 300, with the SAFETY input of the inverter 308 held low, the first input of the second feedback NAND gate 306 is high and the second feedback NAND gate 306 operates as an inverter. A pulsed signal thereby is provided at the 1clk output of the inventive clock generation circuit 300 (as described below). For example, when the global clock signal switches high, the voltage of the first node 204 is pulled low and the output of first output inverter 224 is driven low (e.g., the 1clk output is low). With the 1clk output low, and the second feedback NAND gate 306 operating as an inverter, the output of the second feedback NAND gate 306 is high, causing the first feedback NAND gate 304 to operate as an inverter. With the first node 204 low, the NFET 214 turns ON, and assuming the STOP input is high, then the NFET 216 is ON and the first node 204 is held low.

Thereafter, if the global clock signal switches to a low voltage (and the STOP input is low), the voltage of the first node 204 is pulled high and the output of the first output inverter 224 is driven high (e.g., the 1clk output is high). With the 1clk output high, and the second feedback NAND gate 306 operating as an inverter, the output of the second feedback NAND gate 306 is driven low and the output of the first feedback NAND gate 304 is driven high. A high logic state at the output of the first feedback NAND gate 304 turns OFF the third PFET 212 and turns ON the second NFET 214. Accordingly, assuming the STOP input has been reset high (as described previously), the second PFET 210 is OFF and the third NFET 216 is ON, and the first node 204 is pulled low. A low voltage at the first node 204 switches the output of the first output inverter 224 low (e.g., the 1clk output switches low). Once low, the 1clk output remains low (until the global clock switches from high to low again).

In this manner, the 1clk output of the inventive clock generation circuit 300 goes high in response to a high to low transition of the global clock signal, and then automatically returns low (independent of the global clock signal or its operating frequency) as a result of the feedback path between the 1clk output and the clock generation logic of the clock generation circuit 300. A pulse signal thereby is generated at the 1clk output of the clock generation circuit 300 at each transition of the global clock signal from a high logic state to a low logic state. The pulse width of the pulse signal is set by:

(1) the propagation delay through the second feedback NAND gate 306, the first feedback NAND gate 304, the second inverter 220 and the first output inverter 224; and (2) the time required to pull the first node 204 from a high logic state to a low logic state (e.g., as set by the current drive and/or switching speed of the NFETs 214, 216).

Accordingly, pulse width may be adjusted by changing the speed of the above listed logic gates and/or the current drive and/or switching speed of the NFETs 214, 216. For example, when compared to the corresponding components of the conventional clock generation circuit 200 of FIG. 2, the size of the NFETs 214, 216 may be increased (e.g., to allow the NFETs to drive more current and switch faster), and the size of the inverters 220 and 224 may be increased (e.g., to keep the gain of the inverters low and the switching speed of the inverters high). In at least one embodiment of the invention, a pulse width of about 65 picoseconds is employed, although other pulse widths may be used.

Through use of the present invention, a master-slave latch may be operated in either a pulsed mode of operation or a dual clock mode of operation. Such multiple modes of operation offer significant advantages during circuit design in that failure of master-slave latches to operate in a pulsed mode will not preclude testing of other circuitry. For example, through use of the present invention, a novel method of operating a master latch and a slave latch coupled to the master latch may be provided. The method may include the steps of:

(A) attempting to operate the master latch and the slave latch in a first mode (e.g., a pulsed mode) in which (1) the master latch is held in an open condition; and (2) the slave latch is pulsed so as to latch data passed through the open master latch; and (B) if the master latch and the slave latch do not operate in the first mode, operating the master latch and the slave latch in a second mode (e.g., a dual clock mode) in which (1) a first clock signal is employed to latch data with the master latch; and (2) a second clock signal is employed to latch data latched by the master latch with the slave latch.

Other methods may be similarly employed.

In addition to allowing a master-slave latch to be operated in either a pulsed mode or a dual clock mode of operation, the present invention provides numerous other advantages. For example, the clocking scheme employed by the inventive clock generation circuit 300 is compatible with the clocking scheme used for conventional master-slave latches (e.g., a designer may switch between a pulsed mode and dual clock mode of operation without concern for compatibility issues as the pulse generation circuitry is compatible with existing chip clocking). Accordingly, the same control signals, with the exception of the SAFETY signal for switching between a pulsed mode and a dual clock mode of operation, with the same timing requirements may be employed with a similar launching clock latency. Additionally, the switching logic employed to allow switching between a pulsed mode and a dual clock mode of operation is inexpensive.

As stated previously, when operating in a pulsed mode (e.g., with the SAFETY input low), if the sg_b input is low (e.g., 0 volts), then the d1clk is inactive (e.g., forced low) and the d2clk output is active and approximately complimentary to the 1clk output. Thus, even when operated in a pulse mode, a master-slave latch may be scanned, with d2clk turning off when 1clk is active, so as to prevent racing of scan data through the latch (e.g., avoiding the need to pad scan paths between latches).

The foregoing description discloses only exemplary embodiments of the invention. Modifications of the above disclosed apparatus and method which fall within the scope of the invention will be readily apparent to those of ordinary skill in the art. For instance, while the inventive clock generation circuit 300 has been described with reference to the master-slave latch 100 of FIG. 1, it will be understood that the inventive clock generation circuit may be employed with other master-slave latches. Any of the 1clk, the d1clk and/or the d2clk outputs may be buffered if additional drive is required.

Accordingly, while the present invention has been disclosed in connection with exemplary embodiments thereof, it should be understood that other embodiments may fall within the spirit and scope of the invention, as defined by the following claims.

The invention claimed is:

1. An apparatus comprising:
   a clock generation circuit adapted to couple to a master latch and a slave latch and adapted to operate in:
      a first state in which the clock generation circuit generates:
         a first clock signal for latching data with the master latch; and
         a second clock signal for latching data latched by the master latch with the slave latch; and
      a second state in which the clock generation circuit generates:
         a hold signal for holding the master latch in an open condition; and
         a pulse signal for directing the slave latch to latch data passed through the master latch while the master latch is held in the open condition by the hold signal; and
   a switching circuit coupled to the clock generation circuit and adapted to switch the clock generation circuit between the first state and the second state.

2. The apparatus of claim 1 wherein the first and the second clock signals are approximately complementary clock signals.

3. The apparatus of claim 1 wherein the clock generation circuit is adapted to generate a plurality of clock signals for latching data with the master latch.

4. The apparatus of claim 1 wherein the clock generation circuit comprises:
   at least a first output and a second output;
   clock generation logic adapted to:
      input a global clock signal;
      generate the first clock signal at the first output of the clock generation circuit based on the global clock signal;
      generate the second clock signal at the second output of the clock generation circuit based on the global clock signal;
   feedforward logic adapted to force the first output of the clock generation circuit to a logic state that maintains the master latch in an open condition; and
   feedback logic adapted to feedback the second output of the clock generation circuit to the clock generation logic so as to generate the pulse signal.

5. The apparatus of claim 4 wherein the switching circuit is adapted to place the clock generation circuit in the first state by disabling the feedforward logic and the feedback logic.

6. The apparatus of claim 4 wherein the switching circuit is adapted to place the clock generation circuit in the second state by enabling the feedforward logic and the feedback logic.

7. The apparatus of claim 4 wherein the feedforward logic and the feedback logic are adapted to perform a plurality of NOR operations.

8. An apparatus comprising:
   a clock generation circuit having:
      a first output adapted to couple to a master latch;
      a second output adapted to couple to a slave latch;
      clock generation logic adapted to:
         input a global clock signal;
         generate a first clock signal at the first output of the clock generation circuit based on the global clock signal, the first clock signal for latching data with the master latch;
         generate a second clock signal at the second output of the clock generation circuit based on the global clock signal, the second clock signal for latching data latched by the master latch with the slave latch;
      feedforward logic adapted to force the first output of the clock generation circuit to a pre-determined logic state that maintains the master latch in an open condition; and
      feedback logic adapted to feedback the second output of the clock generation circuit to the clock generation logic so as to generate a pulse signal for directing the slave latch to latch data passed through the master latch while the master latch is in the open condition; and
   a switching circuit is adapted to:
      disable the feedforward logic and the feedback logic so as to place the clock generation circuit in a first state in which the clock generation logic generates the first clock signal for latching data with the master latch and the second clock signal for latching data latched by the master latch with the slave latch; and
      enable the feedforward logic and the feedback logic so as to place the clock generation circuit in a second state in which the feedforward logic forces the first output to the pre-determined logic state for holding the master latch in an open condition and the feedback logic causes the clock generation logic to generate the pulse signal for directing the slave latch to latch data passed through the master latch while the master latch is in the open condition.

9. A method of operating a master latch and a slave latch coupled to the master latch, the method comprising:
   providing a clock generation circuit that is adapted to operate in:
      a first state in which the clock generation circuit generates:
         a first clock signal for latching data with the master latch; and
         a second clock signal for latching data latched by the master latch with the slave latch; and a second state in which the clock generation circuit generates:
  a hold signal for holding the master latch in an open condition; and
  a pulse signal for directing the slave latch to latch data passed through the master latch while the master latch is in the open condition;
attempting to operate the master latch and the slave latch while the clock generation circuit is in the second state; and
if the master latch and the slave latch do not operate while the clock generation circuit is in the second state, switching the clock generation circuit to the first state.

10. The method of claim 9 wherein switching the clock generation circuit to the first state comprises:
  providing a switching circuit adapted to switch the clock generation circuit between the first state and the second state; and
  employing the switching circuit to switch the clock generation circuit from the second state to the first state.

11. The method of claim 9 wherein attempting to operate the master latch and the slave latch while the clock generation circuit is in the second state comprises:
  generating a logic state that maintains the master latch in an open condition;
  employing the logic state to maintain the master latch in the open condition;
  generating the pulse signal; and
  employing the pulse signal to direct the slave latch to latch data passed through the master latch while the master latch is in the open condition.

12. The method of claim 11 wherein generating the logic state comprises employing feedforward logic to force a first output of the clock generation circuit to the logic state; and
  wherein generating the pulse signal comprises employing feedback logic to feedback a second output of the clock generation circuit to clock generation logic so as to generate the pulse signal.

13. The method of claim 12 wherein switching the clock generation circuit to the first state comprises disabling the feedforward logic and the feedback logic.

14. The method of claim 9 further comprising operating the master latch and the slave latch while the clock generation circuit is in the first state.

15. The method of claim 14 wherein operating the master latch and the slave latch while the clock generation circuit is in the first state comprises:
  inputting a global clock signal;
  generating the first clock signal based on the global clock signal;
  providing the first clock signal to the master latch;
  generating the second clock signal based on the global clock signal; and
  providing the second clock signal to the slave latch.

16. The method of claim 15 wherein the first and the second clock signals are approximately complementary clock signals.

17. A method of operating a master latch and a slave latch coupled to the master latch, the method comprising:
  attempting to operate the master latch and the slave latch in a first mode in which:
    the master latch is held in an open condition; and
    the slave latch is pulsed so as to latch data passed through the open master latch; and
  if the master latch and the slave latch do not operate in the first mode, operating the master latch and the slave latch in a second mode in which:
    a first clock signal is employed to latch data with the master latch; and
    a second clock signal is employed to latch data latched by the master latch with the slave latch.

18. The method of claim 17 further comprising employing a switching circuit to switch between the first mode and the second mode.

19. The method of claim 17 wherein the first and the second clock signals are approximately complementary clock signals.

* * * * *